US006765441B1

(12) United States Patent
Terrovitis

(10) Patent No.: US 6,765,441 B1
(45) Date of Patent: Jul. 20, 2004

(54) DIFFERENTIAL AMPLIFIER

(75) Inventor: Manolis Terrovitis, Berkeley, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 10/351,605

(22) Filed: Jan. 24, 2003

(51) Int. Cl.[7] .............................. H03F 3/04; H03F 3/45
(52) U.S. Cl. ........................ 330/250; 330/258; 330/306
(58) Field of Search ................................ 330/250, 258, 330/306

(56) References Cited

U.S. PATENT DOCUMENTS

| 4,468,628 A | * | 8/1984 | Gross .......................... 330/258 |
| 5,420,524 A | * | 5/1995 | Webster ....................... 326/21 |
| 5,422,529 A | * | 6/1995 | Lee ............................. 327/536 |
| 6,211,718 B1 | * | 4/2001 | Souetinov .................... 327/359 |

OTHER PUBLICATIONS

Hegazi,, Emad, et al., "A Filtering Technique to Lower LC Oscillator Phase Noise", IEEE Journal of Solid–State Circuits, vol. 36, No. 12, Dec. 2001.

* cited by examiner

Primary Examiner—Patricia Nguyen
(74) Attorney, Agent, or Firm—Van Pelt & Yi LLP

(57) ABSTRACT

A differential amplifier and a method for amplifying an input signal are disclosed. The differential amplifier comprises an amplification stage configured to amplify an input signal to produce an amplified output, a current source configured to provide a bias current for the amplification stage, and an impedance network connected to the amplification stage and the current source. The impedance network is configured to provide a high common mode impedance within the range of operating frequencies.

28 Claims, 3 Drawing Sheets

DIFFERENTIAL AMPLIFIER

FIELD OF THE INVENTION

The present invention relates generally to differential amplifiers. More specifically, a differential amplifier that has a wide range of operating frequencies is disclosed.

BACKGROUND OF THE INVENTION

Differential amplifiers are often used in applications that require low noise amplification. FIG. 1 is a circuit diagram of a typical differential amplifier. Transistors 100 and 102 are connected to load resistors 104 and 106, respectively. The load resistors are connected to a voltage source, Vcc, at 116. Two input signals are applied to the gate terminals 110 and 112 of transistors 100 and 102. The output is taken between the drain terminals 118 and 120 of the transistors. Ideally, the output represents the difference between the two inputs.

Transistor 108 is a current source for transistors 100 and 102. The sources of transistors 100 and 102 are connected together with the drain of transistor 108, at node 114. Because the circuit is symmetrical, for AC input signals that are opposite of each other, the resulting signals at the sources of the transistors cancel each other at node 114. Thus, node 114 appears as AC ground for differential inputs.

The amplifier sometimes receives common mode inputs at its input interfaces. Common mode input signals are signals that are substantially the same. They are often caused by noise and are undesirable. The common mode signals are rejected when the common mode gain is small. To achieve small common mode gain, the impedance between node 114 and ground should be relatively high. In practice, however, the common mode gain is increased at higher operating frequencies due to parasitic capacitance, and the amplifier's operating frequency range is reduced.

Ideally, the headroom consumed by transistor 108 should be as low as possible, thereby allowing greater output range for transistors 100 and 102. For a given current, a larger transistor can be used to achieve lower headroom. However, a larger transistor generally has larger parasitic capacitance associated with it, and would increase the common mode gain at higher frequencies and reduce the amplifier's operating range. It would be useful to have a differential amplifier design that has low common mode gain at high frequencies, large operating frequency range and better headroom for the output transistors.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of ex ample, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved differential amplifier is disclosed. The amplifier has low common mode gain within its operating frequencies. In one embodiment, the amplifier includes an impedance network that is tuned to increase its common mode impedance at high operating frequencies. In some embodiments, the impedance network includes an inductor. In some embodiments, the impedance network includes a bypass capacitor.

Figure 1:
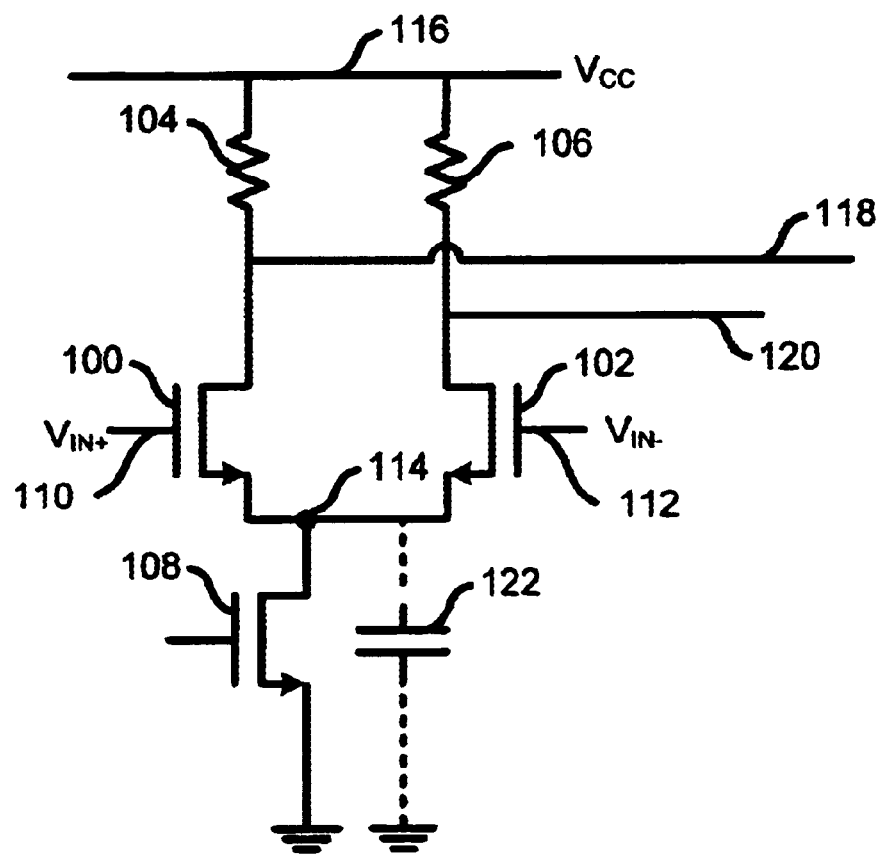
FIG. 1 is a circuit diagram of a typical differential amplifier.

The cause for the poor common mode rejection in existing amplifiers is examined. In FIG. 1, node 114 ideally does not appear as ground to common mode inputs the way it does to differential inputs since the resulting signals from the sources do not cancel. The impedance between node 104 and ground controls the common mode gain of the amplifier, and is referred to as the common mode impedance. Because transistor 108 is configured to have a high output impedance, the common mode impedance between node 114 and ground is high under ideal circumstances. Thus, the common mode gain for the ideal amplifier is significantly less than the differential gain; in other words, the common mode signals are rejected.

In practice, transistors 100, 102 and 108 all have some parasitic capacitance. The effect of the parasitic capacitance is represented by capacitor 122, which is connected in parallel with transistor 108 between node 114 and ground. At lower frequencies, the impedance of capacitor 122 is large and does not affect the impedance between node 114 and ground significantly. At higher frequencies, however, the impedance of capacitor 122 is low and node 114 becomes a virtual AC ground, thereby lowering the common mode impedance between node 114 and ground. Consequently, the common mode gain for the circuit increases, the ability to reject common mode signal decreases, and the range of operating frequencies (also referred to as bandwidth) of the amplifier is limited as a result.

Figure 2:
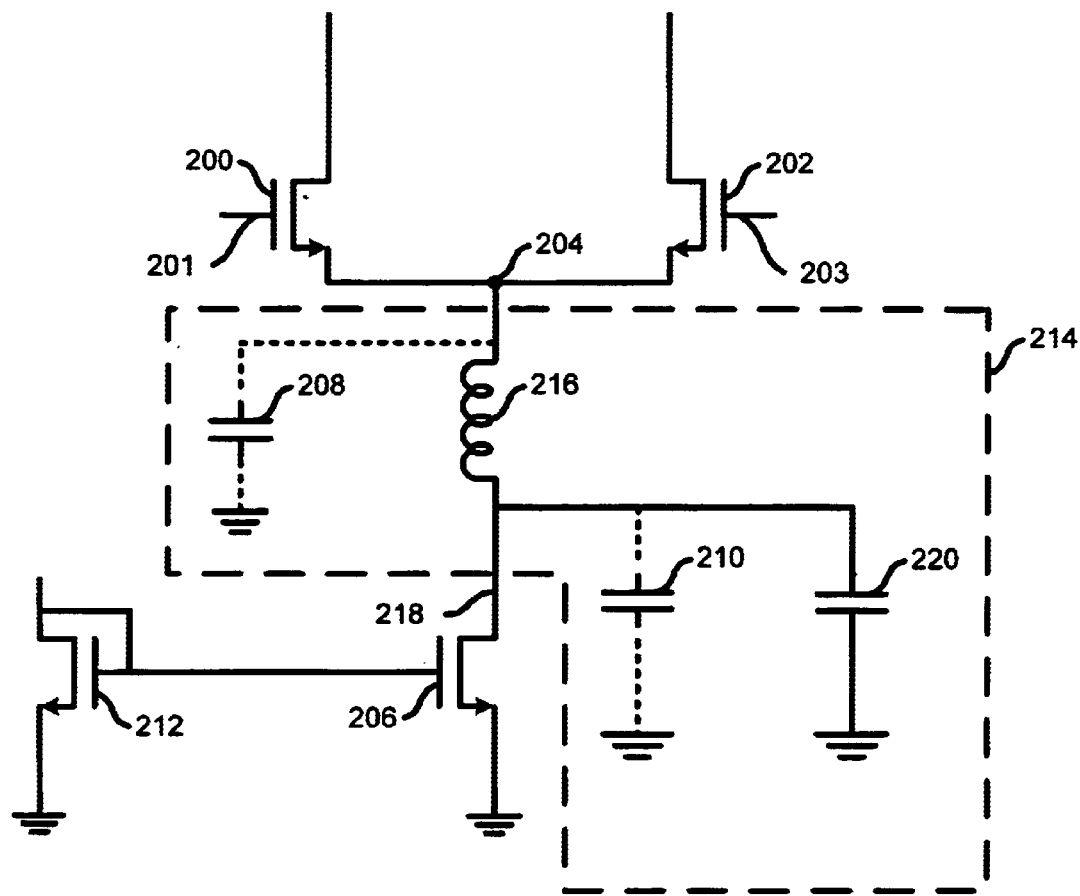
FIG. 2 is a circuit diagram of a differential amplifier embodiment according to the present invention.

FIG. 2 is a circuit diagram of a differential amplifier embodiment according to the present invention. The amplification stage of the differential amplifier includes transistors 200 and 202 that are connected at node 204. Generally, input interfaces may be provided at any appropriate location to receive the input signals. In this embodiment, the input interfaces are gate terminals 201 and 203 of transistors 200 and 202, respectively. Differential outputs may be obtained by applying two input differential signals to the two input interfaces, or by applying a single input to one interface while connecting the other input interface to AC ground. The current source that provides the bias current used in the amplification stage is a current mirror that includes transistors 206 and 212. In other embodiments, the current source employs other techniques to provide the bias current.

The impedance between node 204 and ground is the common mode impedance. Having a high common mode impedance reduces the common mode gain. The amplifier design achieves its high common mode impedance at high frequencies by employing an impedance network connected to the amplification stage and the current source, shown as box 214 in FIG. 2.

In the embodiment shown, the impedance network includes an inductor 216. The inductor is configured to work with the parasitic capacitance of the amplifier to provide high impedance at the amplifier's operating frequencies. The parasitic capacitance is represented by two capacitors 208 and 210, where 208 mainly models the parasitic capacitance of transistors 200 and 202, and 210 mainly models the parasitic capacitance of transistor 206. The values of the parasitic capacitance can be obtained through a variety of methods, such as circuit simulation or direct computation, as is well known to those skilled in the art.

In the embodiment shown, a bypass capacitor 220 is connected in parallel with capacitor 210 to increase the capacitance between node 218 and ground. At high frequencies, a large capacitance results in a low impedance, creating a short circuit between node 218 and ground. Thus, the current source has a low current impedance between node 218 and ground. It should be noted that in some embodiments, the bypass capacitor is omitted if the parasitic capacitance of transistor 206 is high enough to make node 218 appear as ground.

Since node 218 appears as ground, inductor 216 is effectively connected in parallel with capacitor 208. The resonant frequency of the parallel LC circuit is expressed as $$1/2\pi\sqrt{LC},$$

where L is the inductance of 216 and C is the capacitance of 208. At the resonant frequency, the impedance of inductor 216 and capacitor 208 goes to infinity, creating a high common mode impedance that results in good common mode rejection. For the amplifier to achieve the desired operating frequency range, the value of the inductor is chosen so that inductor 216 and capacitor 208 resonate at a desired frequency and produce high impedance in the frequency band near the resonant frequency. Thus, the amplifier has better common mode rejection within the frequency band and a higher operating frequency range than the amplifier shown in FIG. 1.

At lower frequencies, the amplifier operates in a manner similar to the amplifier shown in FIG. 1. The impedance between nodes 218 and ground is high since transistor 206, capacitor 210 and 220 all have high impedance, where as the impedance between nodes 204 and 218 is low since inductor 216 has low impedance. Thus, for common mode signals at low frequencies, the impedance between node 218 and ground appears high, resulting in a small common mode gain.

An additional advantage of the differential amplifier design is that transistor 206 can use a relatively large transistor to provide lower headroom. The increase in parasitic capacitance as a result of having a larger transistor would not affect the amplifier's common mode gain, based on the previous analysis.

Figure 3:
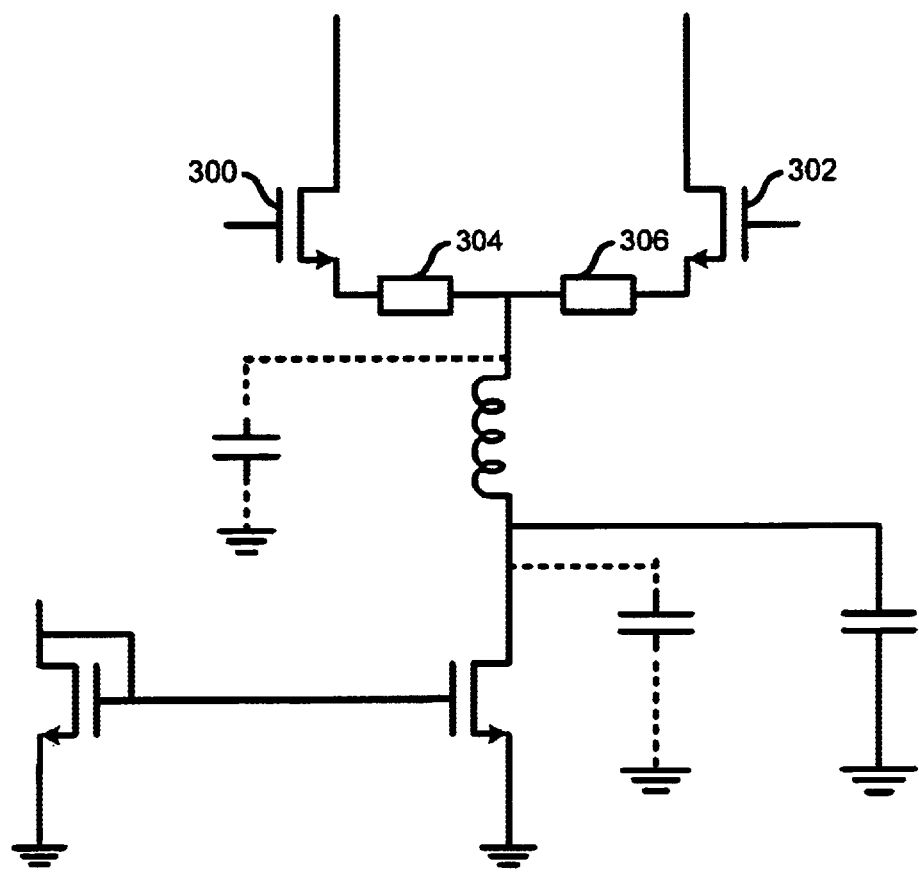
FIG. 3 is a circuit diagram of another differential amplifier embodiment according to the present invention.

FIG. 3 is a circuit diagram of another differential amplifier embodiment according to the present invention. The configuration of this amplifier embodiment is similar to the one shown in FIG. 2. The amplification stage includes transistors 300 and 302. Additionally, it also includes degeneration impedance 304 and 306, connected to the sources of transistors 300 and 302, respectively. The degeneration impedance adjusts the impedance for the transistors and in turn adjusts the amplifier gain. The number of degeneration impedance and the values chosen for the degeneration impedance depend on the implementation.

The differential amplifier design according to the present invention can be used in a variety of applications, including transceivers of wireless devices. The design is well suited for applications that need good common mode rejection at high frequencies. In one embodiment, the differential amplifier is used in a transceiver device of a wireless networking card. The differential amplifier is used in transceiver devices supporting the IEEE (Institute of Electrical and Electronics Engineers) 802.11a and/or 802.11b protocols.

An improved differential amplifier has been disclosed. The amplifier uses a tuned impedance network to compensate the parasitic capacitance present in the circuit. The resulting amplifier has better common mode rejection at high frequencies and broader operating frequency range than existing differential amplifiers.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A differential amplifier having a range of operating frequencies, comprising:
   an amplification stage configured to amplify an input signal to produce an amplified output;
   a current source configured to provide a bias current for the amplification stage; and
   an impedance network connected to the amplification stage and the current source; wherein
   the impedance network is configured to provide a high common mode impedance within the range of operating frequencies.

2. A differential amplifier as recited in claim 1 wherein the impedance network is configured to have a low current source impedance for the current source.

3. A differential amplifier as recited in claim 1 wherein the range of operating frequencies is within the operating ranges specified by IEEE (Institute of Electrical and Electronics Engineers) 802.11a protocol, wherein the range of operating frequencies is within approximately 4.8 GHz–6.0 GHz.

4. A differential amplifier as recited in claim 1 wherein the range of operating frequencies is within the operating ranges specified by IEEE 802.11b protocol, wherein the range of operating frequencies is within approximately 2.3 GHz–2.5 GHz.

5. A differential amplifier as recited in claim 1 wherein the differential amplifier is used in a transceiver device of a wireless networking card.

6. A differential amplifier as recited in claim 1 wherein at high frequencies, the impedance network has high impedance and provides common mode rejection.

7. A differential amplifier as recited in claim 1 wherein the amplification stage comprises a plurality of transistors and an input interface configured to receive an input. signal.

8. A differential amplifier as recited in claim 1 wherein:
   the amplification stage comprises a plurality of transistors and an input interface configured to receive an input signal;
   the plurality of transistors have a parasitic capacitance; and
   the impedance network comprises an inductor combined with the parasitic capacitance.

9. A differential amplifier as recited in claim 1 wherein:
   the amplification stage comprises a plurality of transistors and an input interface configured to receive an input signal;

the plurality of transistors have a parasitic capacitance;

the impedance network comprises an inductor combined with the parasitic capacitance; and the inductor resonates with the parasitic capacitance to produce a high impedance at a desired frequency.

10. A differential amplifier as recited in claim 1 wherein the current source includes a transistor connected to the impedance network.

11. A differential amplifier as recited in claim 1 wherein the current source includes a transistor connected to the impedance network; and the current source further includes a capacitor connected to the current source.

12. A differential amplifier as recited in claim 1 wherein:

the current source includes a transistor connected to the impedance network;

the current source further includes a capacitor connected to the current source; and the capacitor is a bypass capacitor configured to provide low impedance for the current source at high frequencies.

13. A differential amplifier as recited in claim 1 wherein:

the current source includes a transistor connected to the impedance network;

the transistor connected to the impedance network is a large transistor; and the current source has low headroom.

14. A differential amplifier as recited in claim 1 further including a degeneration impedance configured to adjust the gain.

15. A method for amplifying an input signal within a range of operating frequencies, comprising:

receiving the input signal;

amplifying the input signal to produce an amplified output via an amplification stage;

providing a bias current to the amplification stage;

providing a high common mode impedance within the range of operating frequencies via an impedance network.

16. A method for amplifying an input signal within a range of operating frequencies as recited in claim 15 wherein the impedance network is configured to have a low current source impedance for the current source.

17. A method for amplifying an input signal within a range of operating frequencies as recited in claim 15 wherein the range of operating frequencies is within the operating ranges specified by IEEE (Institute of Electrical and Electronics Engineers) 802.11a protocol, wherein the range of operating frequencies is within approximately 4.8 GHz–6.0 GHz.

18. A method for amplifying an input signal within a range of operating frequencies as recited in claim 15 wherein the range of operating frequencies is within the operating ranges specified by IEEE 802.11b protocol, wherein the range of operating frequencies is within approximately 2.3 GHz–2.5 GHz.

19. A method for amplifying an input signal within a range of operating frequencies as recited in claim 15 wherein the differential amplifier is used in a transceiver device of a wireless networking card.

20. A method for amplifying an input signal within a range of operating frequencies as recited in claim 15 wherein at high frequencies, the impedance network has high impedance and provides common mode rejection.

21. A method for amplifying an input signal within a range of operating frequencies as recited in claim 15 wherein the amplification stage comprises a plurality of transistors and an input interface configured to receive an input signal.

22. A method for amplifying an input signal within a range of operating frequencies as recited in claim 15 wherein:

the amplification stage comprises a plurality of transistors and an input interface configured to receive an input signal;

the plurality of transistors have a parasitic capacitance; and the impedance network comprises an inductor combined with the parasitic capacitance.

23. A method for amplifying an input signal within a range of operating frequencies as recited in claim 15 wherein:

the amplification stage comprises a plurality of transistors and an input interface configured to receive an input signal;

the plurality of transistors have a parasitic capacitance;

the impedance network comprises an inductor combined with the parasitic capacitance; and the inductor resonates with the parasitic capacitance to produce a high impedance at a desired frequency.

24. A method for amplifying an input signal within a range of operating frequencies as recited in claim 15 wherein the current source includes a transistor connected to the impedance network.

25. A method for amplifying an input signal within a range of operating frequencies as recited in claim 15 wherein the current source includes a transistor connected to the impedance network; and the current source further includes a capacitor connected to the current source.

26. A method for amplifying an input signal within a range of operating frequencies as recited in claim 15 wherein:

the current source includes a transistor connected to the impedance network;

the current source further includes a capacitor connected to the current source; and the capacitor is a bypass capacitor configured to provide low impedance for the current source at high frequencies.

27. A method for amplifying an input signal within a range of operating frequencies as recited in claim 15 wherein:

the current source includes a transistor connected to the impedance network;

the transistor connected to the impedance network is a large transistor; and the current source has low headroom.

28. A method for amplifying an input signal within a range of operating frequencies as recited in claim 15 further including a degeneration impedance configured to adjust the gain.

* * * * *